United States Patent [19]
Higashi et al.

[11] Patent Number: 5,220,188
[45] Date of Patent: * Jun. 15, 1993

[54] INTEGRATED MICROMECHANICAL SENSOR ELEMENT

[75] Inventors: Robert E. Higashi, Minneapolis; Robert G. Johnson, Minnetonka, both of Minn.

[73] Assignee: Honeywell Inc., Minneapolis, Minn.

[*] Notice: The portion of the term of this patent subsequent to Sep. 18, 2001 has been disclaimed.

[21] Appl. No.: 511,369

[22] Filed: Jul. 6, 1983

[51] Int. Cl.$^5$ .............. H01L 23/56; H01L 27/14; H01L 29/06
[52] U.S. Cl. .................. 257/467; 338/15; 338/18; 156/647
[58] Field of Search ........ 357/29, 25, 26, 28, 357/29, 55; 29/573; 338/15, 18, 22 SD; 156/647

[56] References Cited
U.S. PATENT DOCUMENTS
4,317,126  2/1982  Gragg ................... 357/55
4,472,239  9/1984  Johnson et al. ......... 156/648

Primary Examiner—Andrew J. James
Assistant Examiner—Mark Prenty
Attorney, Agent, or Firm—Michael B. Atlass; A. N. Feldman

[57] ABSTRACT

A sensor element that is adapted to respond to radiation, and which is adapted to the manufacture of a sensor array is manufactured into a single crystal semiconductor means such as silicon. An anisotropically etched pit is provided under the sensing surface, and the pit generally corresponds to the geometry of the sensor element. The geometry is selected to be rectangular and falls along a selected orientation of the particular crystalline structure used for manufacture of the device to thereby allow a high density of sensor elements to provide an efficient array.

12 Claims, 1 Drawing Sheet

INTEGRATED MICROMECHANICAL SENSOR ELEMENT

CROSS-REFERENCED TO RELATED APPLICATION

The present application is related to the subject matter of an application entitled "Micromechanical Thermoelectric Sensor Element" filed on Jul. 6, 1983 as Ser. No. 511,370 in the names of R. E. Higashi and R. G. Johnson and which is assigned to the assignee of the present application.

The present application is also related to the subject matter of an application entitled "Semiconductor Device" filed on Oct. 9, 1981, in the names of R. G. Johnson and R. E. Higashi and which is also assigned to the assignee of the present application.

BACKGROUND OF THE INVENTION

The production of exceedingly small sensing and control devices has been developed to a high state of perfection over the last 30 years. In the last 30 years, the manufacture of mass-produced microelectronic circuits on silicon wafers has become the forerunner of the production of various other devices by similar manufacturing techniques. The fabrication of novel three-dimensional microelectronic devices in a semiconductor crystal, typically silicon, has been accomplished by fabricating the device through many techniques including isotropic and anisotropic etching. These techniques utilize the crystalline structure of a single crystal semiconductor. The techniques had evolved to the point where devices that are only a few thousandths of an inch in dimension are manufactured in quantity.

The state of the art generally can be found in considering the cross-referenced pending patent applications, and in a number of published articles. The citation of this type of article in the present text is provided merely as background, and the articles are not deemed as prior art to the specific invention claimed in this application. Articles of particular interest are found in *IEEE Transactions on Electronics Devices,* Volume Ed-25, No. 10, October 1978, at pages 1178 and 1241. The article appearing at page 1178 is entitled "Fabrication of Novel Three-dimensional Microstructures by the Anisotropic Etching of (100) and (110) Silicon" by E. Bassous. The article appearing at page 1241 is entitled "Dynamic Micromechanics on Silicon: Techniques and Devices" by K. E. Petersen. Also of interest as general background is an article entitled "Silicon Micromechanical Devices" which was published on pages 44-55 of the April 1983 issue of *Scientific American.*

The articles and pending application referenced above show clearly that it is old, and the technique well-known, to manufacture micromechanical devices by etching into a single crystal silicon. The etching techniques generally rely on obtaining the maximum speed of etching, and as such, the planes within the crystal typically dictate the orientation of the device on the surface of the structure The dictation of the orientation of the manufactured device on the surface of a single crystal silicon provides a utilitarian way of producing certain individual devices. Typically, the silicon structure is separated after manufacture so that the individual devices can be utilized separately and the orientation of the device with respect to the crystalline structure usually leaves unused surfaces of the silicon crystal. Sometimes these unused surfaces are adapted for use as an area upon which integrated circuitry is placed to function with the device manufactured by the etching technique. In other cases, the area is merely wasted area.

DESCRIPTION OF THE INVENTION

The present invention is directed to the design and manufacture of a sensor element that can be used in an array of sensor elements to respond to radiation. Where a group of sensor elements are to be placed in an array, the waste of surface area space in the manufacture of the elements is very undesirable. The wasted space tends to make an array of elements inefficient and severely reduces the number of the sensor elements that can be manufactured in a size and configuration that is practical for sensing of radiation.

The present invention is directed to the concept of orienting the sensing element in the most efficient and concentrated configuration. This arrangement is not necessarily the most efficient or practical configuration for the use of an etchant to manufacture rapidly the overall device As such, a practical way must be found to etch a pit under the sensor element which isolates the sensor element thermally from the balance of the silicon semiconductor crystal By properly arranging at least two separate surface areas which semi-enclose the sensing element, an etching arrangement can be provided which is sufficiently rapid to manufacture the device without degrading the quality of the sensing element itself, while limiting the etched pit beneath the sensing element to an area that generally corresponds to the sensing element.

More specifically, the present invention is directed to laying out two areas that effectively interlock with one another in directions along and perpendicular to a selected orientation of the specific crystalline structure within the semiconductor crystal. By arranging the two separate areas properly, a sufficiently fast etch can be obtained to etch out a pit beneath the sensing area without excessively etching the sensing area itself, and where the pit generally has a perimeter defined by planes corresponding to the areas used for etching. The relatively rapid etch does not allow for the degradation of the sensing element, which is thus practically not attacked by the etching fluid, but does allow for a sufficiently rapid etch of the pit. By orienting the surface areas to lie along and perpendicular to a selected orientation of the specific crystalline structure within the semiconductor crystal, the etched pit generally corresponds in size and shape to the sensor element, and this allows the placement of the sensor elements in a close side-by-side relationship, thereby providing an efficient use of the surface of the semiconductor crystal to build a concentrated array of sensor elements. In accordance with the present invention, there is provided an integrated electromechanical sensor element for use in an array of sensor elements which are adapted to respond to radiation, including: single crystal semiconductor means containing a plurality of planes defined by the specific crystalline structure within said semiconductor means; said semiconductor means having a generally flat surface including radiation sensing means having two leadout means; at least two separate surface areas which semi-enclose said sensing means; said two surface areas defining at least two leadout areas with each of said leadout areas providing a support upon which said sensor leadout means are located; a pit below said surface to substantially thermally isolate said sensing means from the balance of said semiconductor means with said pit anisotropically etched through said two surface areas and limited in size by said planes within said single crystal semiconductor means; said planes intersecting said two surface areas which semi-enclose said sensing means to define a parameter of said pit to generally correspond with said two surface areas; and said two surface areas having sides that lie along and perpendicular to a selected orientation of said specific crystalline structure.

Also in accordance with the present invention, there is provided a method of manufacturing an integrated micromechanical sensor element, as part of an array of sensor elements, on a generally flat surface of a single crystal semiconductor means which contains a plurality of planes defined by the specific crystalline structure within said semiconductor means wherein sensor element is adapted to respond to radiation, including the steps of: providing radiation sensing means having at least two leadout means at said semiconductor surface; exposing at least two separate surface areas on said semiconductor surface with said two exposed areas semi-enclosing said sensing means; said two surface areas having sides that lie along and perpendicular to a selected orientation of said specific crystalline structure; said two surface areas defining at least two leadout areas with each of said leadout areas providing a support upon which one each of said sensor leadout means are located; anisotropically etching a pit through said two surface areas with said pit substantially thermally isolating said sensing means from the balance of said semiconductor means; said etched pit being limited in size by said planes within said single crystal semiconductor means; said planes intersecting said two surface areas which semi-enclose said sensing means to define a perimeter of said pit to generally correspond with said two surface areas; and completing the processing of said radiation sensing means.

DESCRIPTION OF THE PREFERRED EMBODIMENTS

Figure 1:
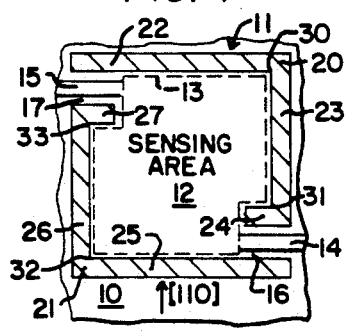
FIG. 1 is a plane view of an embodiment of a sensor element.

In FIG. 1, a plan view of a micromechanical sensor element that has been integrated into the surface 10 of a single crystal semiconductor means is disclosed. The single crystal semiconductor means typically would be silicon, and the surface would be prepared as comparable to the preparation in the art relating to high quality, high density integrated circuits. The orientation of the placement of the sensor element generally disclosed at 11 is important to the present invention, and as such, the sensor element is placed with an axis of its structure oriented parallel to the [110] or equivalent direction of the crystalline structure of the semiconductor means. This point will be explained more in detail after a description of the structure has been presented.

The sensor element 11 is made up of a sensing area 12 identified by the dashed lines 13. The sensing area or radiation sensing means could be a sinuous nickel-iron resistor element (as will be explained in connection with FIG. 3), or an area of deposited pyroelectric material such as zinc oxide. The specific composition of the radiation sensing means 12 is not part of the present invention.

The radiation sensing means 12 has a pair of leadout means 14 and 15 which provide the electrical connections to and from the radiation sensing means 12. The leadout means 14 and 15 are fabricated on a pair of leadout areas 16 and 17 that occur between two separate surface areas 20 and 21 which, before the pit is etched, are surfaces of silicon semiconductor means exposed by window-cuts that define and semi-enclose the sensing means 12. The two separate surface areas 20 and 21 have been shown in a crosshatch merely to identify them and not to indicate that a cross section has been shown. The first surface area 20 has an extended leg 22 and a shorter leg 23 at right angles that, in turn, has a short leg 24 that runs parallel to the extended leg 22. It will be noted that the second surface 21 has an extended leg 25, a short perpendicular leg 26, and a very short leg 27 that is generally parallel to the leg 25. In fact, the two surfaces 20 and 21 are substantially of the same configuration and effectively interlock with one another in directions along and perpendicular to the selected orientation [110] of the silicon crystalline structure upon which the device is prepared.

The relatively long leg 22 of area 20, and the short leg 27 of area 21 define the leadout area 17, while the legs 25 and 24 of the areas 21 and 20 define the leadout area 16. The leadout areas 16 and 17 are made only wide enough to properly carry the two leadout means 14 and 15, and to adequately support the sensing area 12 after the fabrication of the structure, as will be described below.

The areas 20 and 21 are, in fact, areas defined for etching of a pit beneath the sensing area 12 by means of anisotropic etching techniques. The etching occurs at a convenient point in the fabrication of the sensor element into an array on a single crystal semiconductor means surface. Each of the areas 20 and 21 have two convex inner corners identified at 30, 31, 32, and 33. The layout of the sensor element 11 on the surface 10 along with the two separate surface areas 20 and 21 provide for an anisotropically etched pit beneath the sensing area 12. When the etching is accomplished, the etch begins at the convex inner corners and is limited to the outer perimeter of the two separate areas 20 and 21. This is due to the crystalline structure of the semiconductor means which allows the etch to occur until the planes that intersect generally with outer edges of the two surface areas 20 and 21 have been defined. These planes are (111) planes in the silicon crystalline structure. The etching provides a pit beneath the sensing area 12 to thermally isolate the sensing area 12 except at the leadout areas 16 and 17, which have been restricted to a surface area only large enough to provide for the leadout means 14 and 15 and the support of the sensing area 12 over the pit that occurs beneath the sensing area. The etching occurs rapidly enough to provide for the etching of the pit without degradation of the sensing element itself. While the orientation of the surface areas 20 and 21 are selected at less than the most efficient or maximum etching conditions, the etching conditions are sufficiently rapid as to provide an etched pit before the sensing area 12 is attacked by the etchant. This is significantly different than some prior art devices where the prime concern was placing the surface through which an etchant reached the crystalline structure at an orientation which was most efficient for etching, as opposed to being a compromise, as is the case in the present invention. The compromise, however, provides for a rectangular pit that basically is confined to the area under the two separate surfaces 20 and 21. This will be brought in more detail in connection with FIG. 2.

Figure 2:
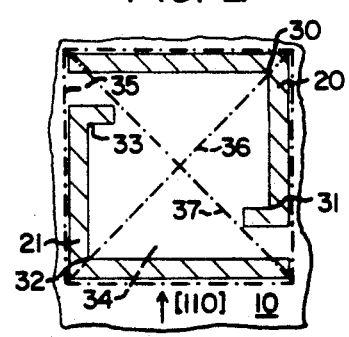
FIG. 2 is a plane view showing the etched pit configuration corresponding to FIG. 1.

In FIG. 2, the pit 34 under a sensing device as disclosed in FIG. 1 is more clearly shown. The surface areas 20 and 21 are again disclosed which are identical to those in FIG. 1. The convex inner corners 30, 31, 32, and 33, and the pit 34 are disclosed and the pit 34 is defined by a perimeter 35 which is shown in a phantom outline. The etching of the device starts at the convex inner corners 30, 31, 32, and 33 and etches out a pit 34 which basically is rectangular in nature at the top as indicated by the phantom outline, 35, and which has downward sloping sides consisting of (111) planes with phantom intersections 36 and 37. The pit 34 is confined to the planes intersecting the two surface areas which semi-enclose the sensing means to define the perimeter 35 of the pit to generally correspond with the two surface areas. The two surface areas have sides that lie along and generally perpendicular to a selected orientation (that is orientation [110] or equivalent) of the specific crystalline structure of the single crystal semiconductor means or silicon upon which surface 10 the device is manufactured. It will be noted that the pit 34 corresponds to the shape of the sensing element without interfering with any area outside of the sensor element 11. As such, a plurality of sensor elements 11 can be placed in very constricted or condensed areas to form an array with a minimum loss of space. In prior art devices, the etching of the pit was such that the orientation of the sensor elements would not allow for side-by-side manufacture, thereby wasting substantial amounts of space and making the manufacture of an integrated micromechanical sensor element into an array of sensor elements less desirable and less efficient.

In the design of the sensor 11, the axis of the structure (the long sides of the areas 20 and 21 as defined by legs 22 and 25) are oriented parallel to the [110] or equivalent directions. Consequently, the edges of these long sides mark the intersection of the (111) surfaces with the (110) surfaces in the silicon, and the etch will not directly eat into the silicon beneath the sensing area 12 beyond these edges. However, at any vertex inner corner of the surface areas or windows, the silicon is attacked by the etch beneath sensing area 12, and is etched away more or less diagonally beginning at the corner of the sensing area 12. In general, etched pits formed by etching through any shaped areas on a (100) silicon surface, such as area 20 and area 21, will be rectangular at each top surface regardless of the shape of the shaped area, and the rectangular dimensions will be determined by the maximum and minimum X and the maximum and minimum Y coordinates of each shaped area. When the resulting rectangles of any two such areas overlap, a single pit is formed which is defined by the maximum and minimum X and Y values of the combined shaped areas. Thus by overlapping the ultimate etched pit area of each window or surface area, a composite etch pit is formed with exactly the desired dimensions and which is limited to the combined areas as defined by the dashed lines 35 in FIG. 2. Thus, no large wasted pit space appears, and the cuts or surface areas 20 and 21 can be narrow and occupy only a small part of the total pit area. Since the contemplated size of the elements used in the array is less than 0.004 inches for the longest dimension, the longer time required for etching that occurs in the crystal axis orientation of the present configuration is not a serious disadvantage.

Figure 3:
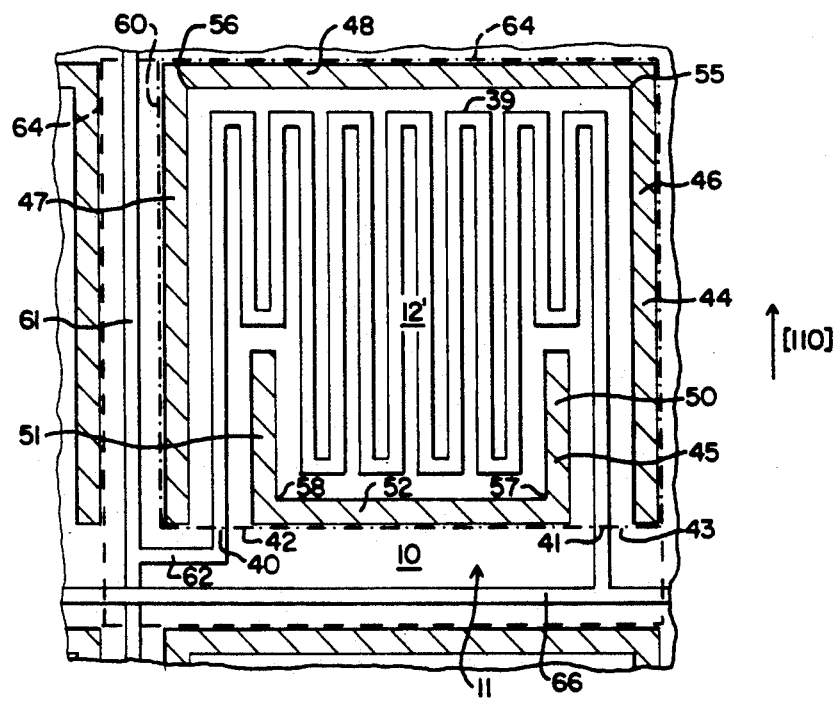
FIG. 3 is a plane view of a preferred embodiment of the sensor element.

In FIG. 3, a preferred embodiment of the integrated micromechanical sensor element for use in an array is disclosed. A semiconductor means surface 10 is disclosed and is again considered to be silicon. The surface would be prepared by techniques common to the micromechanical production techniques and the integrated circuit techniques well-known in the art. A sensor means 12' is provided on this surface and is disclosed as a serpentine or sinuous resistor element 39 which typically could be made of nickel-iron. The sensor element substantially covers the sensing area 12' and has a pair of leadout conductors or leadout means 40 and 41. The leadout means 40 is at a leadout area 42, while the leadout means 41 is at a leadout area 43. The leadout areas 42 and 43 are defined by two separate surface areas 44 and 45. In the sensor of FIG. 3, the two separate surface areas 44 and 45 have been crosshatched merely to identify the areas more clearly, and this identification is not to be considered as a cross section. Each of the surface areas 44 and 45 are U-shape areas having legs and a bight area. The U-shape area 44 has a pair of legs 46 and 47 which are of equal lengths and are connected by a bight 48. The second of the surface areas 45 is again a U-shape element having two equal length legs 50 and 51 connected by a bight 52. The surface area 45 is smaller than the surface area 44, and has its legs 50 and 51 parallel to the legs 46 and 47 to define the leadout areas 42 and 43. The leadout areas 42 and 43 are just wide enough to support the sensor means 12 after an etched pit similar to that shown in FIG. 2 has been anisotropically etched.

It will be noted that the two U-shape surface areas 45 and 46 each have two convex inner corners. The surface area 46 has the inner convex corners 55 and 56, while the U-shape surface area 50 has the two convex inner corners 57 and 58. This configuration of inner convex corners of the two surface areas allows for the etching away of the silicon surface beneath the sensor area 12' in a more or less diagonally arranged configuration beneath the sensing area. The resulting pit associated with each of the two separate surface areas that are used for the window or cut eventually overlap as was disclosed in FIG. 2. A phantom line 60 identifies the perimeter of the pit that can be etched beneath the sensing means 12'.

The individual sensing element disclosed in FIG. 3 is completed by providing a conductor 61 to which the leadout means 40 is connected by a further conductor 62. The conductor 61 leads from one sensing element to another with the total bounds of the sensing element disclosed in FIG. 3 being defined by dashed lines 64. It will be noted that the dashed lines 64 encompasses a slightly larger area than the pit defined by the lines 60. This allows for the necessary grid work of interconnecting conductors to connect the individual sensor elements into an array in a very compact and efficient manner. The sensor element is completed by connecting the leadout means 41 to a further conductor disclosed at 66 which runs at right angles to the conductor 61. The conductor 66 is used to connected a number of sensor elements in an array. This will be brought out schematically in connection with FIG. 5.

Once the pit beneath the sensing area 12 has been etched, the sensing element made up of the sinuous or serpentine resistor element 39 can be completed in the processing step using conventional integrated circuit techniques. As was mentioned in connection with the device disclosed in FIG. 1, the sensing area 12' can be any type of area which is capable of being enclosed by the surface areas 44 and 45. The sensing area 12' is any type of material capable of responding to a variation in radiation and which can be electrically connected into an array. The characteristics of the sensing area 12' are that it does respond to radiation, that it is thermally isolated over the pit defined by the lines 60, and is supported solely by the two leadout areas 42 and 43, thereby thermally isolating the sensing means from the balance of the silicon or single crystal semiconductor means.

Figure 5:
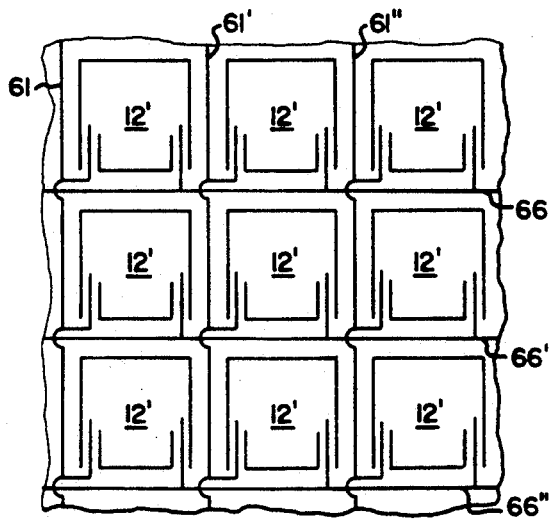
FIG. 5 is a representation of an array of elements of FIG. 3.

In FIG. 5, an array of sensors of the type disclosed in FIG. 3 are shown. The top row contains three sensor elements that are each connected to the conductor 66 while the left most sensor 12' is connected to the conductor 61. Additional conductors 61' and 62' are disclosed that are parallel to the conductor 61, while two additional conductors 66' and 66'' are shown parallelling the conductor 66. As is shown, all nine of the sensor elements disclosed in FIG. 5 are interconnected so that they can be conveniently multiplexed, in a conventional manner, by selecting the proper combinations of conductors.

Figure 4:
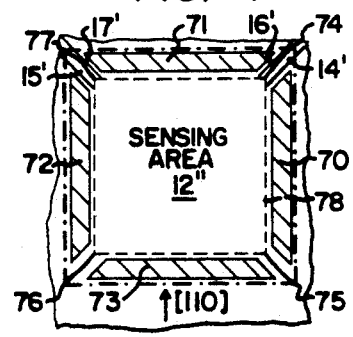
FIG. 4 is a third configuration of surface areas.

In FIG. 4, a further configuration of surface areas used for providing the etching of a pit are disclosed. In FIG. 4, a sensing area is again shown at 12'' which has leadout means 14' and 15' connected to the sensing area 12''. In this particular configuration, four separate surface areas are disclosed at 70, 71, 72, and 73. All four of the areas 70-73 are along individual sides of the sensing area 12'' and have diagonally cut corners. The leadout areas 16' and 17' are oriented at 45° to the [110] planes, each one being quickly etched by an anisotropic etch beneath the sensor area 12'' during processing. When the corner support or leadout areas 16' and 17' are etched beneath, vertex corners 74, 75, 76, and 77 are created. The perimeter of this particular sensor element is defined by the phantom line 78. After the vertex corners 74, 75, 76, and 77 are etched back, the design shown in FIG. 4 will etch to completion more rapidly. A distinction between the configuration of FIG. 1 and that of FIG. 4 is that in FIG. 4, the length of the corner support must exceed the width to form the vertex corner of the supporting area and to complete the etch, whereas in the design of FIG. 1, the length and width of the support area is quite arbitrary as long as the rectangular overlap or interlocking configuration is maintained.

A number of configurations of two separate surface areas that can be used to rectangularly etch a pit beneath a sensing area for the mounting of a sensing means has been disclosed. In all of the cases disclosed, the sensor element etched maintains a pit area that is rectangular and tightly configured to the sensing area. As such, a number of the sensing areas can be economically and compactly manufactured into a single crystal semiconductor means or silicon wafer, thereby providing an economical and efficient array of radiation sensors. Since a number of configurations and techniques have been disclosed, the applicants wish to be limited in the scope of their invention solely by the scope of the appended claims.

The embodiments of the invention in which an exclusive property or right is claimed are defined as follows:

1. An integrated micromechanical sensor element for use in an array of sensor elements which are adapted to respond to radiation, including: single crystal semiconductor means containing a plurality of planes comprising a family of (111) planes defined by the specific crystalline structure within said semiconductor means; said semiconductor means having a generally flat surface supporting radiation sensing means having two leadout means; at least two separate surface areas which semienclosure said sensing means; said two surface areas defining at least two leadout areas which each of said leadout areas providing a support upon which said sensor leadout means are located; a pit below said radiation sensing means to substantially thermally isolate said sensing means from the balance of said semiconductor means with said pit anisotropically etched through said two surface areas and limited in size by said planes within said single crystal semiconductor means; said planes intersecting said two surface areas which semienclose said sensing means to define a perimeter of said pit to generally correspond with said two surface area; and said two surface areas having sides that lie along and perpendicular to a direction of said specific crystalline structure.

2. An integrated micromechanical sensor element as described in claim 1 wherein said separate surface areas are displaced from each other to provide said leadout areas; and said separate areas further effectively interlock in directions along and perpendicular to said direction of said specific crystalline structure.

3. An integrated micromechanical sensor element as described in claim 2 wherein said areas each are shaped to include at least two convex inner corners.

4. An integrated micromechanical sensor element as described in claim 3 wherein said single crystal semiconductor means is silicon.

5. An integrated micromechanical sensor element as described in claim 4 wherein said surface areas each include a pair of parallel legs and a connecting bight that is generally perpendicular to said legs.

6. An integrated micromechanical sensor element as described in claim 5 wherein each of said surface areas is substantially the same in configuration and size with a leg and a bight of each surface area generally adjacent to a separate side of said sensing means.

7. An integrated micromechanical sensor element as described in claim 5 wherein each of said surface areas is substantially of the same configuration but of different sizes so that the legs of a first of said surface areas fit between the legs of a second of said surface areas with the bights of both surface areas generally parallel in position while being on opposite sides of said sensing means; said legs of said surface areas defining said two leadout areas.

8. An integrated micromechanical sensor element as described in claim 7 wherein said legs of said surface areas define said two leadout areas; said two leadout areas being of minimum size to support said sensor means over said pit while providing support for said sensor leadout means.

9. An integrated micromechanical sensor element as described in claim 2 wherein said surface areas are four in number and are substantially the same in configuration; one each of said surface areas being adjacent a side of said sensing means; and adjacent edges of said surface areas defining said two leadout areas.

10. An integrated micromechanical sensor element as described in claim 9 wherein said single crystal semiconductor means is silicon.

11. An integrated micromechanical sensor element as described in claim 6 wherein said legs of said surface areas define said two leadout areas; said two leadout areas being of minimum size to support said sensor means over said pit while providing support for said sensor leadout means.

12. An integrated micromechanical sensor element as described in claim 9 wherein said legs of said surface areas define said two leadout areas; said two leadout areas being of minimum size to support said sensor means over said pit while providing support for said sensor leadout means.

* * * * *